United States Patent [19]

Graiver et al.

[11] Patent Number: 4,545,914

[45] Date of Patent: Oct. 8, 1985

[54] CONDUCTIVE ELASTOMERS FROM ELECTRICALLY CONDUCTIVE FIBERS IN SILICONE EMULSION

[75] Inventors: Daniel Graiver, Midland; Robert E. Kalinowski, Auburn, both of Mich.

[73] Assignee: Dow Corning Corporation, Midland, Mich.

[21] Appl. No.: 645,986

[22] Filed: Aug. 31, 1984

[51] Int. Cl.[4] ............................................. H01B 1/06
[52] U.S. Cl. .................................... 252/511; 252/502; 252/503; 523/137
[58] Field of Search ............... 252/506, 511, 510, 502, 252/503, 513, 514; 523/137; 524/495, 496, 439, 401

[56] References Cited

U.S. PATENT DOCUMENTS

| | | | |
|---|---|---|---|
| 3,583,930 | 6/1971 | Ehrreich et al. | 252/514 |
| 3,706,695 | 12/1972 | Huebner | 252/506 |
| 4,011,360 | 3/1977 | Walsh | 428/402 |
| 4,221,688 | 9/1980 | Johnson et al. | 524/251 |
| 4,244,849 | 1/1981 | Saam | 524/442 |

Primary Examiner—Josephine L. Barr
Attorney, Agent, or Firm—Edward C. Elliott

[57] ABSTRACT

A composition which provides an electrically conductive product upon removal of the water at ambient conditions is described. The composition comprises a dispersed phase of elastomer and a continuous phase of water containing a material selected from the group comprising colloidal silica, alkali metal silicates, and organosilicates. Also present in the continuous phase is greater than 10 parts by weight of electrically conductive particles in the form of fibers having a diameter of less than 25 micrometers and a length of less than 10 millimeters with the ratio of length to diameter of greater than 10:1. Upon drying, the emulsion yields an electrically conductive elastic product having elastomer particles and electrically conductive fibers dispersed in a solid polar continuous phase. The electrically conductive product is particularly useful as an efficient shield for electromagnetic radiation in the radio and television frequencies.

19 Claims, No Drawings

CONDUCTIVE ELASTOMERS FROM ELECTRICALLY CONDUCTIVE FIBERS IN SILICONE EMULSION

BACKGROUND OF THE INVENTION

1. Field of the Invention

This invention relates to elastomers formed from aqueous emulsions which are made electrically conductive by the inclusion of electrically conductive fibers.

2. Background Information

An emulsion which can form an electrically conductive silicone rubber is disclosed by Huebner et al. in U.S. Pat. No. 3,706,695, issued Dec. 19, 1972. They claim the use of from 8 to 35 weight percent of carbon black based upon the combined weight of siloxane and carbon black. Their Example 2 shows volume resistivity of the cured product varying from $2.11 \times 10^5$ ohm-cm using 8.6 weight percent carbon black to $6.39 \times 10^3$ ohm-cm using 30 weight percent carbon black.

U.S. Pat. No. 3,583,930, issued June 8, 1971, to Ehrreich et al. teaches that a plastic mass is made conductive by adding metal powders having a surface area to volume ratio of from 450 to 200,000 square feet/cubic foot. The maximum particle size is 100 mils (2.54 mm) preferably 40 mils (1.0 mm) while the minimum is 0.5 mil (0.013 mm) when a noble metal surface is used. Non-noble metals require a minimum size of about 5 mils. Included in plastic mass is elastomeric silicone resin.

U.S. Pat. No. 4,011,360, issued Mar. 8, 1977, to Walsh discloses the use of 75 to 98 parts by weight of electrically conductive particles in 2 to 25 parts by weight of a room temperature curing silicone rubber to obtain an electrically conductive flexible cured silicone rubber. The particle size may be between 5 micrometers to 10,000 micrometers. The mixtures cure upon exposure to water.

SUMMARY OF THE INVENTION

A composition which provides an elastomeric, electrically conductive product upon removal of the water at ambient conditions comprises (A) a dispersed phase of elastomer and a continuous phase of water containing a material selected from the group comprising colloidal silica, alkali metal silicates, and organosilicates, and (B) greater than 10 parts by weight of electrically conductive particles in the form of fibers having a diameter of less than 25 micrometers and a length of less than 10 millimeters with the ratio of length to diameter of greater than 10:1. The composition, upon removal of the water, yields an elastic product comprising dispersed particles of elastomer and electrically conductive fibers in a solid polar continuous phase. The cured emulsion has a surface resistivity of less than 2 ohms per square on at least one surface.

The composition of this invention can be used to coat a substrate to produce an electrically conductive, elastomeric coating which serves as an efficient shield for electromagnetic interferences.

DESCRIPTION OF THE INVENTION

This invention relates to a composition which provides an elastomeric electrically conductive product upon removal of the water under ambient conditions comprising (A) an emulsion of a dispersed phase of elastomer and a continuous phase of water containing a material selected from the group comprising colloidal silica, alkali metal silicates, and organosilicates, said emulsion being an aqueous oil-in-water emulsion, having at least 20 percent by weight water, that cures upon drying at ambient temperature to an elastomeric film, and (B) greater than 10 parts by weight of electrically conductive particles in the form of fibers having a diameter of less than 25 micrometers and a length of less than 10 millimeters with the ratio of length to diameter of greater than 10:1, based upon 100 parts by weight of non-volatile material in (A), the composition yielding an elastic product, obtained by drying the composition at room temperature, comprising dispersed particles of elastomer and electrically conducting fibers in a solid polar continuous phase, and having a surface resistivity of less than 2 ohms per square on at least one surface.

In our modern society more and more of our machinery is becoming powered or controlled by electric and electronic means. Many of these devices generate electromagnetic radiation in their operation. A common example is the high frequency radiation generated by an electrical spark such as when a switch is turned on or off or by the spark plug in an internal combustion engine. This high frequency radiation is dispersed to the surroundings unless the source is properly shielded. Many other devices such as radios, television sets, and electronic devices such as computers which contain circuits based upon semiconductor chips are severly effected in their operation by such extraneous radiation unless they are properly shielded to prevent such stray radiation from reaching their electronic circuits. Films cast from the emulsion of this invention have been found to be particularly efficient in forming a coating for shielding devices from electromagnetic interferences, when tested over a frequency range of from 0.5 to 1000 megaHertz.

The emulsion, (A), of this invention is an emulsion which contains a dispersed phase of elastomer. The preferred emulsion particles are present in the aqueous, oil-in-water emulsion as particles which are crosslinked while the water is still present. Inter-particle crosslinks occur during the drying or curing of the emulsion upon the removal of the water from the emulsion.

(A) also contains a material, selected from the group comprising colloidal silica, alkali metal silicate, and organosilicate dispersed in the continuous water phase. This material provides reinforcement for the dried elastic product and/or participates in the crosslinking of the elastomer. The exact function of this material is discussed further in the discussion below on different types of preferred crosslinked elastomer useful in this invention.

The emulsions used in this invention are made electrically conductive by the addition of greater than 10 parts by weight of electrically conductive particles in the form of fibers having a diameter of less than 25 micrometers and a length of less than 10 millimeters with the ratio of length to diameter of greater than 10:1. The electrically conductive fibers are preferably metal-coated graphite fibers because these fibers have a high electrical conductivity because of the metal coating. The high electrically conductivity of the fibers allows less to be used to reach a given electrical conductivity in the elastic product. When electrically conductive fibers such as uncoated graphite fibers are used, higher amounts are necessary. Metal-coated graphite fibers are commercially available with coatings of metals such as silver, gold, and nickel in a continuous length or chopped into lengths such as 1 to 10 millimeters. Preferred are nickel-coated graphite fibers present in an amount of from 10 to 25 parts by weight, having a diameter of from about 5 to 15 micrometers and a length of from about 1 to 5 millimeters.

Fibers such as stainless steel were found to be more difficult to disperse uniformly and to give less conductivity than the nickel coated graphite fibers. The fibers may be coated with a silane to increase compatibility with the emulsion (A). Various types of fibers and various lengths of fibers can be combined in a given emulsion.

Emulsions as defined in part (A) of this invention are uniquely useful in providing the elastomeric, electrically conductive product of this invention. Because the dispersed elastomer particles of the preferred emulsion are crosslinked before the electrically conductive fibers are added, the fibers remain dispersed in the continuous phase of the emulsion and do not become a part of the dispersed elastomer particles. As the emulsion is dried, the dispersed elastomer particles and the dispersed fibers are brought closer and closer together. In the dried film, it is believed that the fibers are found in random contact with each other with the crosslinked elastomer particles occupying the space between them; the crosslinked elastomer particles being bound to each other through a solid continuous polar phase resulting from the colloidal silica, alkali metal silicate or organosilicate. The result of this unique morphology of the dried product is an unusually efficient use of the fibers to establish electrical conductivity in the product. The amount of the fibers required to reach a surface resistivity of 2 ohms per square is much less than that required when other types of emulsions are used, as shown in Example 3.

The emulsion, (A), is an aqueous emulsion having a dispersed phase of elastomer and a continuous phase of water containing a material selected from the group comprising colloidal silica, alkali metal silicates and organosilicates; which, upon removal of the water, yields an elastic product comprising dispersed particles of elastomer in a solid polar continuous phase.

Preferred emulsions for (A) are silicone emulsions, that is, emulsions in which the elastomer is based upon polydiorganosiloxane. A silicone emulsion having a dispersed phase of an anionically stabilized hydroxylated polydiorganosiloxane and a colloidal silica and a continuous phase of water in which the pH is 9 to 11.5 as described in U.S. Pat. No. 4,221,688, issued Sept. 9, 1980, to Johnson et al. is a preferred emulsion for use in this invention as part (A). U.S. Pat. No. 4,221,688 is hereby incorporated by reference to disclose the emulsion and method of manufacture of such an emulsion. Hydroxylated polydiorganosiloxanes are those which impart elastomeric property to the product obtained after removal of the water from the emulsion. They should have a weight average molecular weight of at least 5,000, preferably in a range of 200,000 to 700,000. The organic radicals of the hydroxylated polydiorganosiloxane can be monovalent hydrocarbon radicals containing less than seven carbon atoms per radical and 2-(perfluoroalkyl)ethyl radicals containing less than seven carbon atoms per radical. The hydroxylated polydiorganosiloxanes preferably contain at least 50 percent methyl radicals with polydimethylsiloxane being preferred. The hydroxylated polydiorganosiloxanes are preferably those which contain about 2 silicon-bonded hydroxyl radicals per molecule.

The most preferred hydroxylated polydiorganosiloxanes are those prepared by the method of anionic emulsion polymerization described by Findley et al. in the U.S. Pat. No. 3,294,725 which is hereby incorporated by reference to show the methods of polymerization and to show the hydroxylated polydiorganosiloxane in emulsion. Another method of preparing hydroxylated polydiorganosiloxane is described by Hyde et al. in U.S. Pat. No. 2,891,920 which is hereby incorporated by reference to show the hydroxylated polydiorganosiloxanes and their method of preparation.

The emulsion of U.S. Pat. No. 4,221,688, cited above, requires colloidal silica as an ingredient. Any of the colloidal silicas can be used, the preferred colloidal silicas are those which are available in an aqueous medium. Aqueous colloidal silicas which have been stabilized with sodium ion are particularly useful because the pH requirement can be met by using such a sodium stabilized colloidal silica without having to add additional ingredients to bring the pH within the 9 to 11.5 range. The preferred amount of colloidal silica is from 1 to 25 parts by weight for each 100 parts by weight of polydiorganosiloxane.

The emulsion of U.S. Pat. No. 4,221,688 cited above makes use of an organic tin compound, preferably a diorganotindicarboxylate to reduce the storage time between the preparation of the emulsion and the time an elastomeric product can be obtained from the silicone emulsion by removal of the water under ambient conditions to an acceptable range of one to three days. The diorganotindicarboxylate can be used in amounts of from 0.1 to 2 parts by weight for each 100 parts by weight of the polydimethylsiloxane. The preferred diorganotindicarboxylate is dioctyltindilaurate.

The emulsion of U.S. Pat. No. 4,221,688 cited above is prepared by a method consisting essentially of emulsifying a hydroxylated polydiorganosiloxane which contains about 2 silicon-bonded hydroxyl radicals per molecule using an anionic surfactant and water, adding a colloidal silica and an organic tin compound and adjusting the pH of the resulting emulsion to a range from 9 to 11.5 inclusive.

Another emulsion useful as (A) of this invention is described in U.S. Pat. No. 4,244,849 issued Jan. 13, 1981, to Saam, hereby incorporated by reference to disclose the emulsion and method of manufacture of such an emulsion. This emulsion comprises a continuous water phase and an anionically stabilized dispersed silicone phase which is a graft copolymer of a hydroxyl endblocked polydiorganosiloxane and an alkali metal silicate which is present in the continuous water phase. The emulsion has a pH within the range from 8.5 to 12 inclusive. The hydroxyl endblocked polydiorgano- siloxane useful in this embodiment is the same as that described above. The alkali metal silicates that are suitable are water soluble silicates, preferably employed as an aqueous solution. Preferred is sodium silicate in an amount of from 0.3 to 30 parts by weight for each 100 parts by weight of polydiorganosiloxane. During the preparation of the emulsion an organic tin salt is added to catalyze the reaction of the hydroxyl endblocked polydiorganosiloxane and the alkali metal silicate. A diorganotindicarboxylate is a preferred organic tin salt with from 0.1 to 2 parts by weight employed for each 100 parts by weight of polydiorganosiloxane. The preferred diorganotindicarboxylate is dioctyltindilaurate.

These emulsions are preferably prepared by mixing together an anionically stabilized aqueous emulsion of hydroxyl endblocked polydiorganosiloxane, aqueous solution of alkali metal silicate, and organic tin salt in an emulsion so that all the ingredients are initially present as dispersed particles in water. The pH of the emulsion is adjusted to a range of from 8.5 to 12 inclusive if necessary. Upon aging, the silicate and polydiorganosiloxane form a graft copolymer of dispersed particles in which the polydiorganosiloxane becomes crosslinked. If the emulsion is dried, an elastomer is formed.

Another emulsion useful as (A) of this invention is described in U.S. Pat. No. 4,248,751 issued Feb. 3, 1981 to Willing, hereby incorporated by reference to disclose the emulsion and its method of manufacture. For use in this invention, the emulsion includes the addition of colloidal silica. This emulsion is the emulsion produced by a process comprising emulsifying (C) a vinyl endblocked polydiorganosiloxane and (D) an organosilicon compound having silicon-bonded hydrogen atoms using water and surfactant to form an emulsion, adding a platinum catalyst and heating the emulsion to form a dispersed phase of crosslinked silicone elastomer, then adding colloidal silica. The vinyl endblocked polydiorganosiloxane (C) preferably is a polydiorganosiloxane terminated by triorganosiloxy groups and having two vinyl radicals per molecule, no silicon atom having more than one vinyl radical bonded thereto. The remaining organic radicals are preferably those with six carbon atoms or less with the preferred organic radicals being selected from the group consisting of methyl, ethyl, phenyl, and 3,3,3-trifluoropropyl radicals, at least 50 percent of the radicals being methyl radicals. The polydiorganosiloxane should have a viscosity of from 0.1 to 100 Pa's at 25° C.

In this embodiment, the organosilicon compound (D) can be any compound or combination of compounds containing silicon-bonded hydrogen atoms useful as crosslinkers and providing an average of silicon-bonded hydrogen atoms per molecule of (D) of at least 2.1. Such compounds are known in the art as illustrated in U.S. Pat. No. 3,697,473, issued Oct. 10, 1972 to Polmanteer et al., which is hereby incorporated by reference to show such organosilicon compounds. A preferred organo-silicon compound is a mixture which consists essentially of (1) an organosiloxane compound containing two silicon-bonded hydrogen atoms per molecule and the organic radicals being selected from the group consisting of alkyl radicals having from 1 to 12 carbon atoms inclusive, phenyl, and 3,3,3-trifluoropropyl radicals, no silicon atom having bonded thereto more than one silicon-bonded hydrogen atom, and said organosiloxane compound (1) having no more than 500 silicon atoms per molecule, and (2) an organosiloxane compound containing at least 3 silicon-bonded hydrogen atoms per molecule, the organic radicals being selected from the group consisting of alkyl radicals having from 1 to 12 carbon atoms inclusive, phenyl, and 3,3,3-trifluoropropyl radicals, no silicon atom having bonded thereto more than one silicon-bonded hydrogen atom and said organosiloxane compound (2) having no more than 75 silicon atoms per molecule. This mixture is such that at least 10 percent of the silicon-bonded hydrogen atoms are derived from (1) or (2) and the combination of (1) and (2) provides 100 weight percent of the mixture. For use in the instant invention, organosiloxane compound (2) can have as many silicon-bonded hydrogen atoms per molecule as there are silicon atoms per molecule. The organosilicon compound is preferably added in an amount such that there are present from 0.75 to 1.50 silicon-bonded hydrogen atoms in the compound (D) for each vinyl radical in the vinyl endblocked polydiorganosiloxane (C).

The emulsion of this embodiment is produced by emulsifying polydiorganosiloxane (C) and organosiloxane compound (D) in water and a surfactant as shown in U.S. Pat. No. 4,248,751, cited above. After the emulsion of (C) and (D) has been made, a platinum catalyst is added. The emulsion is then heated to form a dispersed phase of crosslinked silicone elastomer as the ingredients (C) and (D) react in the presence of the platinum catalyst. After the crosslinked polymer is formed, colloidal silica is added to the emulsion, preferably in the form of an aqueous dispersion of a colloidal silica. The amount of colloidal silica is not critical, up to 70 parts by weight can be added with about 25 parts by weight of silica per 100 parts by weight of elastomer being preferred. If the emulsion is dried, the product is a dispersed phase of crosslinked elastomer in a solid polar continuous phase formed by the colloidal silica.

Another emulsion useful in part (A) of this invention is described in U.S. Pat. No. 4,273,634 issued June 16, 1981, to Saam et al. which is hereby incorporated by reference to show the characteristics and method of manufacture of an emulsion useful in this invention when colloidal silica is also present in the emulsion. The emulsion of this embodiment comprises an emulsion prepared by (E) first forming a stabilized dispersion of hydroxyl endblocked polydiorganosiloxane containing sufficient vinyl substituted siloxane units to facilitate the crosslinking of the polydiorganosiloxane and having a weight average molecular weight of at least 5000. The preferred weight average molecular weight is in the range of from 200,000 to 700,000. The organic radicals of the hydroxyl endblocked polydiorganosiloxane can be monovalent hydrocarbon radicals containing less than seven carbon atoms per radical and 2-(perfluoroalkyl)ethyl radicals containing less than seven carbon atoms per radical. It is preferred that at least 50 percent of the radicals are methyl radicals with a preferred polydiorganosiloxane being a copolymer containing dimethylsiloxane units and methylvinylsiloxane units. The amount of vinyl-substituted siloxane units is not critical, typically about 0.03 to 0.06 mole percent of the vinyl-substituted siloxane units are preferred.

A preferred method of forming the stabilized dispersion is to prepare the polydiorganosiloxane by emulsion polymerization, preferably by the method of U.S. Pat. No. 3,294,725 cited above.

After the dispersion of hydroxyl endblocked polydiorganosiloxane containing vinyl substituted siloxane units has been made, it is treated to provide a crosslinking action by forming radicals within the dispersed polydiorganosiloxane. Any of the methods known in the art to produce radicals that will crosslink the polydiorganosiloxane can be employed in the present invention as long as the radicals can be generated within the dispersed particles without breaking or coagulating the dispersion. Generally, crosslink-inducing radicals can be produced by energy activation of the polydiorganosiloxane directly or by energy activation of radical-producing agents dissolved in the droplets.

A method of producing radicals by energy activation of the dispersed polydiorganosiloxane directly is to expose the dispersion to high energy radiation as by exposure to gamma radiation until crosslinking takes place. Another method is by energy activation of a radical-producing agent which is dissolved in the silicone particles of the dispersion. A preferred radical producing agent includes any of the well-known organic peroxides which are suitable for vulcanizing silicone rubber. The radical-producing agent is dissolved in the emulsion and then the emulsion is heated to the elevated temperature at which the agent produces radicals so that the polydiorganosiloxane is crosslinked.

After the polydiorganosiloxane in the emulsion is crosslinked, colloidal silica is added to the emulsion, preferably in the form of an aqueous dispersion of colloidal silica. The amount of colloidal silica is not critical, up to 70 parts by weight can be added with a preferred amount from about 10 to 25 parts by weight of colloidal silica per 100 parts by weight of polydiorganosiloxane.

Another emulsion, (A), of this invention is described in the patent application Ser. No. 624,545, titled "Polydiorganosiloxane Latex", by Huebner and Saam, filed on June 26, 1984 and having the same assignee as this application, which is hereby incorporated by reference to describe the emulsion and its method of manufacture. In this method of producing an aqueous emulsion of crosslinked polydiorganosiloxane, a hydroxyl endblocked polydiorganosiloxane is mixed with a hydrolyzable silane having 3 or 4 hydrolyzable groups, a surface active anionic catalyst selected from the group consisting of a compound of the formula $R'C_6H_4SO_3H$ wherein $R'$ is a monovalent aliphatic hydrocarbon radical of at least 6 carbon atoms and a compound of the formula $R'OSO_2OH$ wherein $R'$ is as defined above, and sufficient water to form an oil-in-water emulsion. The mixture is immediately homogenized, then allowed to polymerize at a temperature of from about 15° to 30° C. for at least 5 hours at a pH of less than 5 until a crosslinked polymer is formed. The crosslinked polymer emulsion is then neutralized to a pH of greater than 7 and reinforced by adding greater than 1 part by weight of colloidal silica sol or silsesquioxane.

The composition of this invention is prepared by mixing the emulsion (A) with the electrically conductive particles in the form of fibers (B). Because of the fluidity of the emulsion (A), it is a simple matter to stir in the fibers. At least 10 parts by weight of the fibers is necessary in order to obtain the desired degree of electrical conductivity. The preferred amount of nickel coated graphite fibers is in the range of from 10 to 25 parts by weight per 100 parts by weight of non-volatile material (A). In this application, the non-volatile content of (A) is defined as the amount of material remaining when a 2 gram sample is placed in an aluminum drying cup and heated for one hour at 150° C. in an air circulating oven. The percent non-volatile material measured in this manner approximates the amount of non-volatile material obtained upon drying at ambient conditions for 7 days. For a given weight of fibers, the electrical conductivity is related to the average length of the fibers with fibers of longer length giving a more conductive product. Because of the ease with which the metal coated fibers can be mixed with the emulsion (A) there is little damage to the metal coating. This may not be the case when a material such as a high viscosity silicone rubber is mixed with metal-coated fibers to produce an electrically conductive rubber. The electrically conductive fibers of part (B) can be mixed into the emulsion of (A) by any means which creates a low degree of shear and does not introduce air into the mixture. In the case of small samples, hand mixing with a spatula is sufficient, taking care to stir the mixture so that the conductive fibers are well dispersed in the emulsion, but not stirring vigorously enough to beat air into the emulsion. For larger amounts, paddle stirrers having the blades set so that a vortex is not created can be used. A preferred mixing method uses a closed container which contains a central shaft which can be moved up and down through the mixture. Perforated plates the same size as the container are attached to the shaft. As the shaft and plates are moved up and down, the mixture flows with turbulence through the perforations in the plates, causing the dispersion of the fibers without subjecting the fibers to high shear forces which would tend to break them. By adjusting the mixer so that the moving plates do not rise above the surface of the mixture, little air is introduced into the mixture. Any other mixing method which disperses the fibers without significantly breaking or cutting them into shorter lengths and without introducing significant amounts of air into the mixture can be used. High speed, high shear mixers such as Waring blenders and Epenbach mixers cause excessive fiber breakage. The shorter fibers produced by such mixing methods do not produce as high an electrical conductivity in the elastic product as in the case where a low shear mixer is used.

Coatings produced from the composition of this invention have been found to be particularly effective as shielding for stopping electromagnetic interferences at radio and television frequencies. The enclosure for an apparatus generating electromagnetic interferences or the enclosure of an apparatus which is sensitive to interferences radiation may be coated with the emulsion of this invention. The coating is dried to yield a continuous film having adhesion to the substrate and an electrical resistivity of less than 2 ohms per square. Tests have shown the elastic product comprising particles of crosslinked elastomer dispersed in the solid polar continuous phase with the electrically conductive fibers being dispersed in the continuous phase is a very good electromagnetic shield. When tested at radio and television frequencies, greater than 99.999 percent of the transmitted energy was stopped by the coating.

Because emulsion (A) of this invention allows simple mixing with the fibers (B), a homogeneous mixture is easily produced. The viscosity and flow characteristics of the mixture can be regulated by adjusting the solids content and by the addition of flow control agents and thixotropy agents such as the sodium salts of polyacrylates. Thixotropic mixtures have sufficient viscosity so that the electrically conductive fibers do not settle out during the drying of the film. The inherent thermal resistance, excellent weatherability, and chemical inertness of the emulsion used in this invention gives the electrically conductive elastic product of this invention these same desirable properties in addition to its electrical conductivity.

The following examples are presented for purposes of illustrating the invention and should not be construed as limiting the scope of the invention which is properly delineated in the claims.

EXAMPLE 1

A composition was prepared using nickel-coated graphite fibers to impart electrical conductivity.

First, an anionically stabilized, emulsion polymerized polydimethylsiloxane was prepared by homogenizing hydroxyl endblocked polydimethylsiloxane fluid, water, and sodium lauryl sulphate surfactant, then adding dodecylbenzene sulfonic acid to polymerize the fluid in the emulsion. After polymerization, the emulsion was neutralized with diethylamine. The finished emulsion was about 58 percent by weight of non-volatile material with the polydimethylsiloxane having a weight average molecular weight of about 325,000.

This first emulsion was then converted to an emulsion having a dispersed phase of crosslinked elastomer by mixing 100 parts by weight of a 15 percent by weight dispersion of colloidal silica with 2 parts by weight of diethylamine, then adding 167 parts by weight of the first emulsion described above along with 0.3 parts of a 30 percent by weight solids silicone antifoam and 1 part by weight of a 50 percent by weight solids solution of dioctyltindilaurate. This emulsion was then thickened by adding 10 parts by weight of an acrylic thickening agent having a 30 percent by weight solids content. This thickened emulsion had a non-volatile content of about 40 percent by weight.

The thickened emulsion was made electrically conductive by mixing 250 parts by weight of the emulsion with 20 parts by weight of nickel-coated graphite fibers. The fibers had a nominal diameter of 8 micrometers with the nickel coating being 0.5 micrometers thick. The fibers were a nominal 3.2 mm in length. The fibers had been treated on the surface with a silane. The fibers were distributed uniformly and with minimal breakage throughout the thickened emulsion by adding the emulsion and fibers to a special mixing device. The mixing device was a container having a sealable top with a shaft through the center having a series of 4 plates mounted on the shaft and essentially covering the entire diameter of the container. The shaft and the attached plates could be driven up and down from the top of the container to the bottom. Each of the plates had a majority of its surface full of holes, the bottom plate having holes which were rectangular slots while the upper plates had holes of decreasing diameters. The upper plate was essentially a screen having holes of about 2 millimeters in diameter. The fibers were distributed through the emulsion by forcing the plates up and down through the mixture, causing the mixture to flow back and forth through the multitude of holes in the plates. The mixing device causes turbulent flow within the mixture, but does not cause a vortex as in stirred mixers that tends to beat air into the mixture and cause foaming. The rate at which the plates are moved up and down is regulated so that air is not forced into the mixture by the mixing action.

An electrically conductive sample was prepared by pouring a portion of the above mixture into a container to a depth of about 1 mm and then allowing the water to evaporate under ambient conditions. After drying for 3 days, the elastomeric sample was removed from the container and the electrical conductivity was measured by placing a pair of 1 cm long electrodes 1 cm apart on the surface of the sample and measuring the resistance with an ohm meter. Measurements were made by lightly placing the electrodes on the top surface and the bottom surface. The top surface measured 1 ohm per square resistance and the bottom surface measured 3.2 ohms per square. When the top surface was measured under hand pressure on the jig, the resistance measured from 0.6 to 1 ohm per square.

EXAMPLE 2

A series of mixtures were prepared using an emulsion having a dispersed phase of crosslinked elastomer and a continuous phase containing colloidal silica with various amounts of nickel-coated graphite.

A crosslinked elastomer emulsion was prepared by mixing 172 parts by weight of the anionically stabilized, emulsion polymerized polydimethylsiloxane, 100 parts of the colloidal silica dispersion, 0.2 parts of the dispersion of dioctyltindilaurate, 2 parts of diethylamine, and 9.6 parts of the acrylic thickening agent, all ingredients as described in Example 1. The emulsion had a pH of about 10.5, a viscosity of about 50 Pa's at 25° C., and a non-volatile content of about 42 percent by weight. A sample of the emulsion had the properties shown in Table I.

Portions of the emulsion having 100 parts of non-volatile material were mixed with the parts of the nickel-coated graphite fibers of Example 1 as shown in Table I. The fibers were dispersed in the emulsion and samples of cured, conductive elastomer were prepared as in Example 1. The samples were tested for electrical conductivity as in Example 1 and for physical properties according to ASTM D 412. The results are shown in Table I.

The results show that there must be greater than 10 parts by weight of this nickel-coated graphite fiber per 100 parts by weight of non-volatile material in order to reach a conductivity level sufficient to obtain a measurement of less then 2 ohms per square resistivity. The fibers cause a loss of tensile strength and elongation and an increase in modulus when added to the elastomer.

TABLE I

| Nickel-coated Graphite Fiber parts | Resistivity, ohms per square | | | Tensile Strength MPa | Elongation percent | Initial Modulus MPa |
| --- | --- | --- | --- | --- | --- | --- |
| | Top | Bottom | Pressure | | | |
| None | — | — | — | 2.64 | 605 | 6.01 |
| 20 | 2.0 | 2.3 | 1.3 | 1.06 | 17 | 4.09 |
| 10* | 8.5 | 23 | 12 | 1.87 | 27 | 3.22 |
| 5* | 629 | 2470 | 370 | 1.76 | 54 | 4.41 |

*Comparative examples

EXAMPLE 3

A comparison was made of electrically conductive films from compositions containing the mixture of this invention with a styrene-butadiene rubber emulsion and an acrylic emulsion.

The composition of this invention was prepared by mixing 236 g of the crosslinked elastomer emulsion of Example 2 with 12.27 g of the nickel-coated graphite fibers of Example 1, using the mixing method of Example 1. The mixture had about 11.4 parts by weight of nickel-coated graphite fibers per 100 parts by weight of emulsion non-volatile material. The sample was cured and tested for electrical properties as in Example 1 with the results shown in Table II. The electrical conductivity was measured on each surface under pressure.

A styrene-butadiene rubber emulsion sample was prepared by mixing 300 g of a commercial emulsion having 50 percent by weight solids (Dow Chemical Company 223 Latex) with 1.5 g of a 50/50 mixture of methylcellulose and glycerol to thicken the emulsion. Then 17.15 g of the nickel-coated graphite fibers were added and mixed as in the first sample above. This sample had about 11.4 parts by weight of nickel-coated graphite fibers per 100 parts by weight of emulsion solids. The sample was then cured and tested as above with the results shown in Table II.

An acrylic emulsion sample was prepared by mixing 300 g of a commercial emulsion having 38 percent by weight solids (Rohm and Haas, Acrysol WS-68 acrylic emulsion) with 7 g of a 50/50 mixture of methylcellulose and glycerol to thicken the emulsion. Then 13.0 g of the nickel-coated graphite fibers were added and mixed in as in the first sample above. This sample had about 11.4 parts by weight of nickel-coated graphite fibers per 100 parts by weight of emulsion solids. The sample was then cured and tested as above with the results shown in Table II.

Although each mixture contained the same amount of electrically conductive fibers, the silicone composition based sample was much more conductive.

TABLE II

| Emulsion | Resistivity ohms per square | |
|---|---|---|
| | Top | Bottom |
| Silicone | 1.3 | 1.5 |
| Styrene-Butadiene | 6.8 | 30 |
| Acrylic | 4.0 | * |

*Sample adhered to container so that bottom surface could not be measured.

EXAMPLE 4

A series of samples were prepared to compare the properties of films made from a composition of this invention, a silicone rubber, and a room temperature silicone sealant, each containing electrically conductive fibers in the same amount.

The first sample was prepared by mixing 238 parts by weight of the crosslinked elastomer emulsion of Example 2 with 20 parts by weight of the nickel-coated graphite fibers of Example 1, using the method of mixing of Example 1. Samples of cured conductive elastomer were prepared as in Example 1, then tested as in Example 2 with the results as shown in Table III.

A silicone rubber sample was prepared by milling 20 parts by weight of the nickel-coated graphite fibers into 100 parts by weight of a commercial silicone rubber base containing 100 parts by weight of polydimethylsiloxane gum, 23 parts of fumed silica reinforcement and 0.5 parts of organic peroxide catalyst. The sample was molded into a sheet in a press and cured for 10 minutes at 165° C. The cured sample was tested as above with the result shown in Table III.

A sealant sample was prepared by milling 20 parts by weight of the nickel-coated graphite fibers into 100 parts by weight of a commercial room temperature curing silicone sealant that cured through exposure to moisture, giving off acetic acid as a byproduct. The sample was formed into a sheet, then allowed to cure. The properties were measured as above with the results shown in Table III.

A comparison of the three elastomers containing the same amount of electrically conductive fibers shows that the sample prepared from the composition of this invention is much more electrically conductive. The sample prepared using the silicone emulsion has a lower tensile strength and elongation than the rubber and sealant samples.

TABLE III

| Elastomer | Resistivity ohms per square | Tensile Strength MPa | Elongation percent | Initial Modulus MPa |
|---|---|---|---|---|
| Emulsion | 1.0 | 0.68 | 17 | 1.87 |
| Rubber | 160 | 2.49 | 356 | 4.11 |
| Sealant | n.c. | 2.45 | 28 | 1.45 | n.c.-is non-conductive

EXAMPLE 5

A sample of a composition of this invention was tested as a shielding material for preventing radiation from electrical devices.

A film was cast as in Example 2 using 20 parts by weight of the nickel-coated graphite fibers per 100 parts by weight of crosslinked elastomer emulsion non-volatile material. The surface resistivity of the sample prepared and cured as in Example 1 was 1.4 ohms per square. A test specimen was cut from the film and installed in a coaxial transmission line set up to measure the shielding effectiveness of samples by determining the amount of energy shunted by the sample from the inner conductor of the coaxial cable to the outer conductor. Tests were performed at different frequencies and the decibels of energy shunted were measured. Shielding values of 30 to 40 decibels are considered to be average with a value of 60 decibels considered to be 99.9999 percent effective. The volume resistivity of the sample in place in the test device was measured as 0.00 ohm-cm. The shielding effectiveness of the sample was measured as shown in Table IV. The film was a very effective shielding material over this range of frequencies.

TABLE IV

| Test Frequency megaHertz | Shielding Effectiveness decibels |
|---|---|
| 0.5 | 51 |
| 1.5 | 51 |
| 5 | 51 |
| 15 | 52 |
| 50 | 53 |
| 250 | 61 |
| 500 | 66 |
| 1000 | 58 |

That which is claimed is:

1. A silicone composition which provides an elastomeric electrically conductive product upon removal of the water under ambient conditions comprising
    (A) an emulsion of a dispersed phase of silicone elastomer, and a continuous phase of water containing a material selected from the group comprising colloidal silica, alkali metal silicates, and organosilicates, said emulsion being an aqueous oil-in-water emulsion, having at least 20 percent by weight water, that cures upon drying at ambient temperature to an elastomeric film, and
    (B) from 10 to 25 parts by weight of electrically conductive particles in the form of fibers having a diameter of less than 25 micrometers and a length of less than 10 millimeters with the ratio of length to diameter of greater than 10:1, said particles being selected from the group consisting of graphite, stainless steel, and metal-coated graphite fibers where the metal coating is silver, gold, or nickel, based upon 100 parts by weight of non-volatile material in (A), the composition yielding an elastic product, obtained by drying the composition at room temperature, comprising dispersed particles of elastomer and electrically conducting fibers in a solid polar continuous phase, and having a surface resistivity of less than 2 ohms per square on at least one surface.

2. The composition of claim 1 in which the electrically conductive particles are present in an amount of from 10 to 25 parts by weight and are nickel-coated graphite fibers having an average diameter of from about 5 to 15 micrometers and a length of from about 1 to 5 mm.

3. The composition of claim 2 in which the nickel-coated graphite fibers have a silane coating.

4. The composition of claim 1 in which the emulsion (A) is a silicone emulsion suitable to provide an elastomeric product upon removal of the water under ambient conditions comprising a continuous aqueous phase and a dispersed phase, the dispersed phase consisting essentially of an anionically stabilized hydroxylated polydiorganosiloxane which contains about 2 silicon-bonded hydroxyl radicals per molecule, an organic tin compound, and a colloidal silica, said silicone emulsion having a pH in a range of 9 to 11.5 inclusive.

5. The composition of claim 4 in which the polydiorganosiloxane is a polydimethylsiloxane having a weight average molecular weight in a range of 200,000 to 700,000, the colloidal silica is present in a amount of from 1 to 25 parts by weight for each 100 parts by weight of polydimethylsiloxane, and the organic tin compound is a diorganotindicarboxylate present in an amount of from 0.1 to 2 parts by weight for each 100 parts by weight of the polydimethylsiloxane.

6. The composition of claim 1 in which the elastomer of emulsion (A) comprises a graft copolymer of hydroxyl endblocked polydiorganosiloxane and an alkali metal silicate, the silicone emulsion having a pH within the range from 8.5 to 12 inclusive.

7. The composition of claim 6 in which the hydroxyl endblocked polydiorganosiloxane is a polydimethylsiloxane having an average molecular weight in a range of 200,000 to 700,000, the alkali metal silicate is a sodium silicate employed in an amount of from 0.3 to 30 parts by weight for each 100 parts by weight of polydimethylsiloxane, and there is also present an organic tin salt.

8. The composition of claim 7 in which the organic tin salt is a diorganotindicarboxylate present in an amount of from 0.1 to 2 parts by weight for each 100 parts by weight of polydimethylsiloxane.

9. The composition of claim 1 in which the emulsion (A) comprises the emulsion produced by a process comprising emulsifying (C) a vinyl endblocked polydiorganosiloxane and (D) an organosilicon compound having silicon-bonded hydrogen atoms using water and surfactant to form an emulsion, adding a platinum catalyst and heating the emulsion to form a dispersed phase of cross-linked silicone elastomer, then adding colloidal silica.

10. The composition of claim 9 in which the vinyl endblocked polydiorganosiloxane (C) is a polydiorganosiloxane terminated by triorganosiloxy groups and having two vinyl radicals per molecule, no silicon atom having more than one vinyl radical bonded thereto, the remaining organic radicals being selected from the group consisting of methyl, ethyl, phenyl, and 3,3,3-trifluoropropyl radicals, at least 50 percent of the organic radicals being methyl radicals, and said polydiorganosiloxane having a viscosity of from 0.1 to 100 Pa's at 25° C., and the organosilicon compound (D) is a mixture of silicon compounds providing from 0.75 to 1.50 silicon-bonded hydrogen atoms per vinyl radical of (C), said mixture (D) consisting essentially of (1) an organosiloxane compound containing two silicon-bonded hydrogen atoms per molecule and the organic radicals being selected from the group consisting of alkyl radicals having from 1 to 12 carbon atoms inclusive, phenyl and 3,3,3-trifluoropropyl, no silicon atom having bonded thereto more than one silicon-bonded hydrogen atom, and said organosiloxane compound (1) having no more than 500 silicon atoms per molecule, and (2) an organosiloxane compound containing at least 3 silicon-bonded hydrogen atoms per molecule, the organic radicals being selected from the group consisting of alkyl radicals having from 1 to 12 carbon atoms inclusive, phenyl and 3,3,3-trifluoropropyl radicals, no silicon atom having bonded thereto more than one silicon-bonded hydrogen atom, and said organosiloxane compound (2) having no more than 75 silicone atoms per molecule, said mixture (D) being such that at least 10 percent of the silicon-bonded hydrogen atoms are derived from (1) and at least 10 percent of the silicon-bonded hydrogen atoms are derived from (2), (1) and (2) composing 100 weight percent of mixture (D).

11. The composition of claim 1 in which the emulsion (A) comprises an emulsion prepared by (E) first forming a stabilized dispersion of hydroxyl endblocked polydiorganosiloxane containing sufficient vinyl substituted siloxane units to facilitate the crosslinking of the polydiorganosiloxane and having a weight average molecular weight of at least 5000 and then, (F) treating the dispersion to provide a crosslinking action by forming radicals within the dispersed polydiorganosiloxane, then adding colloidal silica.

12. The composition of claim 10 in which the radicals are formed within the dispersed polydiorganosiloxane by exposing the dispersion to high energy radiation.

13. The composition of claim 11 in which the radicals are formed within the dispersed polydiorganosiloxane by the combined action of heat and a radical-producing agent.

14. The composition of claim 11 in which the polydiorganosiloxane is a copolymer containing dimethylsiloxane units and methylvinylsiloxane units, the copolymer having a weight average molecular weight of 200,000 to 700,000.

15. The elastomeric, electrically conductive product produced by drying the composition of claim 1.

16. The elastomeric, electrically conductive product produced by drying the composition of claim 4.

17. The elastomeric, electrically conductive product produced by drying the composition of claim 6.

18. The elastomeric, electrically conductive product produced by drying the composition of claim 9.

19. The elastomeric, electrically conductive product produced by drying the composition of claim 11.

* * * * *